(12) United States Patent
Nan

(10) Patent No.: US 8,514,646 B1
(45) Date of Patent: Aug. 20, 2013

(54) METHOD FOR IMPROVING PERFORMANCE WHEN FLASH MEMORY STORAGE DEVICE WORKS IN WIDE TEMPERATURE RANGE

(75) Inventor: Yen Chih Nan, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 0 days.

(21) Appl. No.: 13/467,992

(22) Filed: May 9, 2012

(51) Int. Cl.
*G11C 7/04* (2006.01)

(52) U.S. Cl.
USPC . 365/212; 365/211; 365/185.02; 365/185.09; 365/185.17; 365/185.33

(58) Field of Classification Search
USPC ............. 365/185.02, 185.09, 185.17, 185.22, 365/185.21, 185.33, 211, 212
See application file for complete search history.

(56) References Cited

U.S. PATENT DOCUMENTS 8,305,811 B2 * 11/2012 Jeon .......................... 365/185.18
2007/0091677 A1 * 4/2007 Lasser et al. ............. 365/185.09

\* cited by examiner

*Primary Examiner* — Andrew Q Tran
(74) *Attorney, Agent, or Firm* — Che-Yang Chen; Law Office of Michael Chen

(57) ABSTRACT

A method of a flash memory storage device using Read Retry method is disclosed. This method includes using a thermal sensor to records temperature information while programming flash memory, and using this temperature information to compensate the temperature difference between program and read operation to improve Read Retry performance.

2 Claims, 6 Drawing Sheets

METHOD FOR IMPROVING PERFORMANCE WHEN FLASH MEMORY STORAGE DEVICE WORKS IN WIDE TEMPERATURE RANGE

FIELD OF THE INVENTION

The present invention provides a method for reducing the number of tests in Read Retry operation. The lesser tests are used in Read Retry operation, and the better performance is getting for flash memory storage device.

BACKGROUND OF THE INVENTION

Nowadays, flash memories are very common in storage system. Various kinds of memory technology make different flash types. NAND flash memory is one of the most popular memory devices for storage. With advantages of high speed, high density, and low power consumption, and low cost, so NAND flash is widely used in mobile system, including mobile phone, MP3 player, digital camera, tablet PC, and etc. Temperature tolerance is an important factor for mobile devices. Temperature sensitivity is one characteristic of NAND flash memory, especially for more advanced process technology. When an error bit number is over capability of ECC correction limit, the Read Retry method will be applied to fix this problem. Legacy Read Retry method is capable for overcoming this problem, but usually not effective. Legacy Read Retry method, tests different sense voltage one by one from minimum to maximum, may take a time before find out the suitable sense voltage. This read retry sequence could result in significant sudden performance drop. Steady read/write performance is important for mobile application. This invention introduces an effective way to decrease tests in Read Retry. With additional temperature information of current temperature and programming temperature, better testing sequence for different sense voltages can be achieved to save time.

Please refer to FIG. 1, which is a flowchart showing a conventional flash memory write command process.

The steps of a conventional flash memory write command process are:
- step S11: receiving a "WRITE" command (CMD); and
- step S12: writing data into a flash memory.

Please refer to FIG. 2, which is a flowchart shown a conventional flash memory read command process. The steps of the process are:
- step S21: receiving a "READ" command (CMD);
- step S22: reading data from a NAND flash memory;
- step S23: judging if the Cyclic Codes match; if yes, terminates the process; if no, runs to next step;
- step S24: checking if an ECC engine can correct; if yes, the ECC engine starts to correct (step S241); if no, runs to next step;
- step S25: applying a voltage VT1 as a first test voltage for Read Retry to a memory cell array;
- step S26: reading data from the NAND flash memory;
- step S27: judging if the Cyclic Codes match; if yes, runs to step S241; if no, runs to next step;
- step S28: checking if the ECC engine can correct; if yes, runs to step S241; if no, runs to next step; and
- step S29: checking if all available test voltages VTn are tried; if yes, reports an uncorrectable error (step S291); if no, applying another test voltage VTn (step S292) and loops to step S22.

When an error bit number is over the ECC engine capability, multiple sense voltages will be tested in sequence. These test voltages start from VT1, the lowest voltage level, to VTn, the highest voltage level. Once the error bit number of the flash data is within ECC engine coverage, then the ECC engine would recover these error bits.

However, shown as FIG. 3, a first pulse curve CU1 under a first temperature, such as room temperature, and a second pulse curve CU2 under a second temperature, such as programming temperature higher than room temperature (same as for lower than room temperature), are different, where the horizontal axis is time and the vertical axis is the quantity of data. Under the first temperature, the process starts from VT1 to VTn, e.g. VT1 to VT7. But under the second temperature, the second pulse curve CU2 is shifted to right of the first pulse curve CU1 and the process also starts from VT1 to VTn to test, e.g. compared to the first pulse curve CU1, VT1 to VT2 are failed and VT3 to VT7 are passed.

No matter the temperature is, the process always starts from VT1. It is wasting much time for testing.

Please also refer to U.S. publication application No. US20100322007 (hereafter '007), which A flash memory device and method of reading data are disclosed. The method includes; performing a test read operation directed to test data stored in a memory cell array of the flash memory device by iteratively applying a sequence of test read retry operations, wherein each successive test read retry operation uses a respectively higher test read voltage level than a preceding test read retry operation, until one test read retry operation in the sequence of test read retry operations successfully reads the test data using a minimum test read retry voltage associated with the one test read retry operation, setting an initial read voltage for the flash memory device equal to the minimum test read retry voltage, and thereafter performing a normal read operation directed to user data stored in the memory cell array by iteratively applying a sequence of read retry operations, wherein an initial read.

However, the method of '007 which is correcting the error resulting from different temperature of the flash memory is less of efficiency.

SUMMARY OF THE INVENTION

An objective of this invention is providing a method for improving performance when a flash memory storage device works in a wide temperature range, which is capable of shortening the test time according to the current temperature sensed by a thermal sensor and improving the efficiency.

To achieve above objectives, A method for improving performance when a flash memory storage device works in a wide temperature range, and the steps of the method are comprising:
- step SA01: received a read CMD;
- step SA02: read data from a NAND flash memory;
- step SA03: judging if the Cyclic Codes match; if yes, terminates the process; if no, runs to next step;
- step SA04: checking if an ECC engine can correct; if yes, the ECC engine starts to correct; if no, runs to next step;
- step SA04': getting a current temperature and a programming temperature from a thermal sensor;
- step SA05: checking a Read Retry Record table; check if a physical address has ever applied a Read Retry method and has proper start test voltage record; if yes, jumps to next two step; if no, runs to next step;
- SA06: calculating a Read Retry start test voltage according to the current temperature and the programming temperature;
- step SA07: applying the Read Retry start test voltage to a memory cell array;
- step SA08: reading data from the NAND flash memory;

step SA09: judging if the Cyclic Codes match; if yes, saves the current test voltage to the Read Retry Record table; if no, runs to next step;

step SA10: checking if the ECC engine can correct; if yes, runs to step SA04; if no, runs to next step; and step SA11: checking if all available test voltages are tried; if yes, reports an uncorrectable error; if no, applying another test voltage and loops to step SA08.

Wherein, the thermal sensor may be disposed inside or outside the NAND flash memory.

Further features and advantages of the present invention will become apparent to those of skill in the art in view of the detailed description of preferred embodiments which follows, when considered together with the attached drawings and claims.

BRIEF DESCRIPTION OF THE DRAWINGS

All the objects, advantages, and novel features of the invention will become more apparent from the following detailed descriptions when taken in conjunction with the accompanying drawings.

DESCRIPTION OF THE PREFERRED EMBODIMENT

Figure 1:
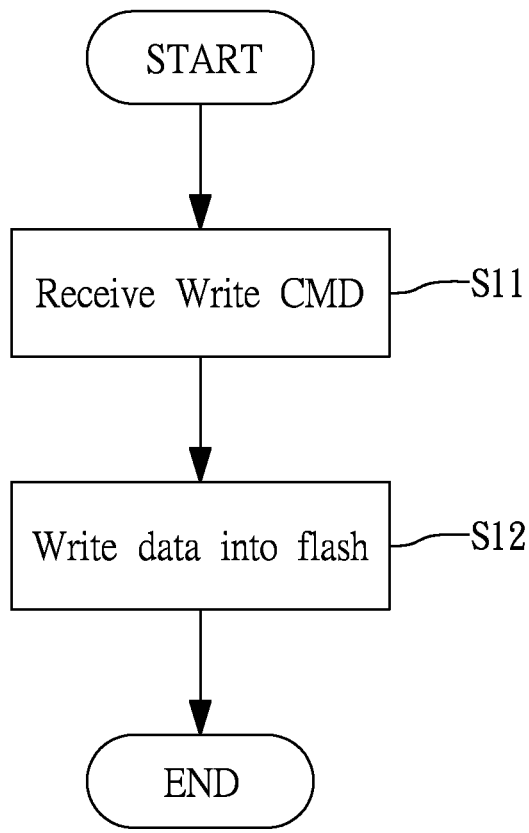
FIG. 1 is a flowchart showing a conventional flash memory write command process.
Figure 2:
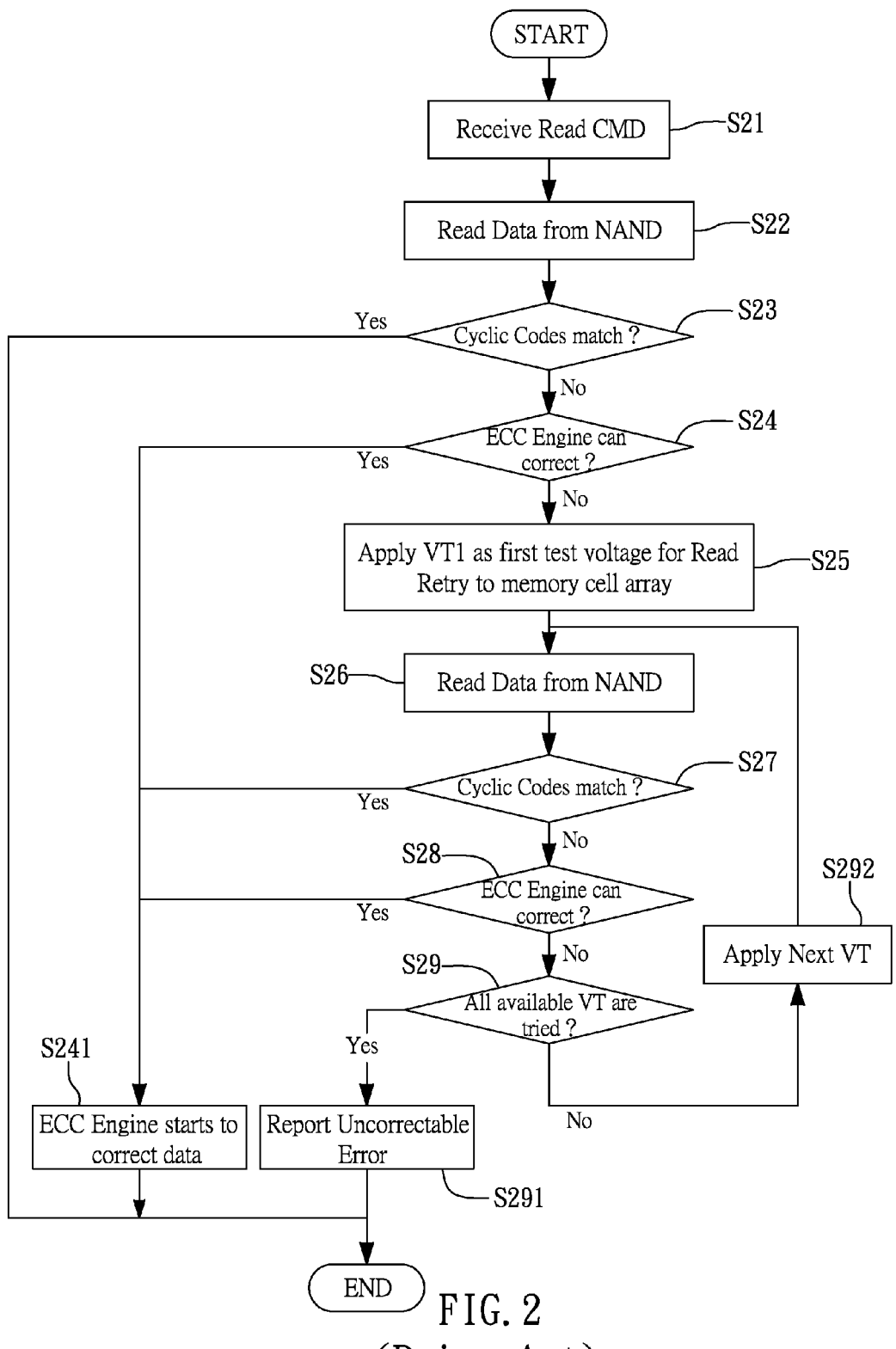
FIG. 2 is a flowchart showing a conventional flash memory read command process.

Referring now to the drawings where like characteristics and features among the various figures are denoted by like reference characters.

Figure 4:
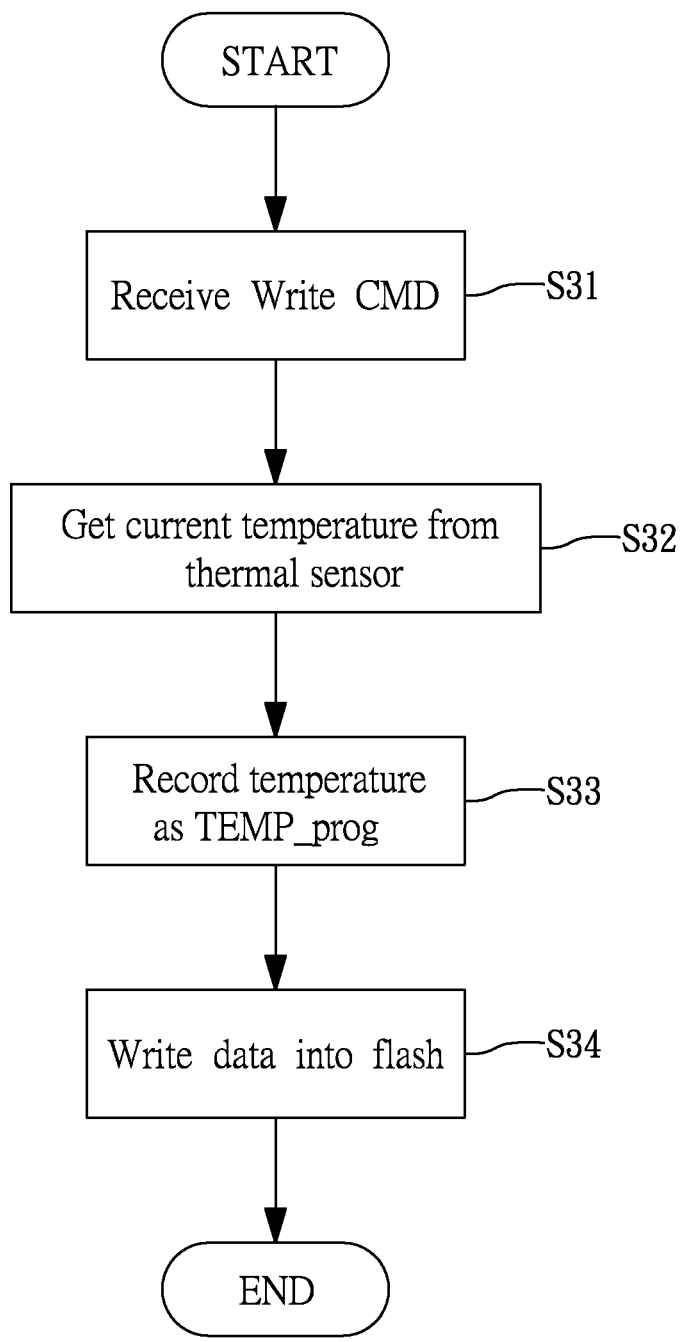
FIG. 4 is a flowchart showing a flash memory device handling write command according to an embodiment of present invention.

Please refer to FIG. 4, which is a flowchart showing a flash memory device handling write command according to an embodiment of present invention.

The normally steps for the process of a flash memory device handling write command according to an embodiment of present invention are:

step S31: receiving write command (CMD);

step S32: getting a current temperature from a thermal sensor;

step S33: recording the current temperature as TEMP_prog (programming temperature); and step S34: writing data into a flash memory.

The thermal sensor (not shown) may be disposed inside or outside the flash memory.

Figure 5:
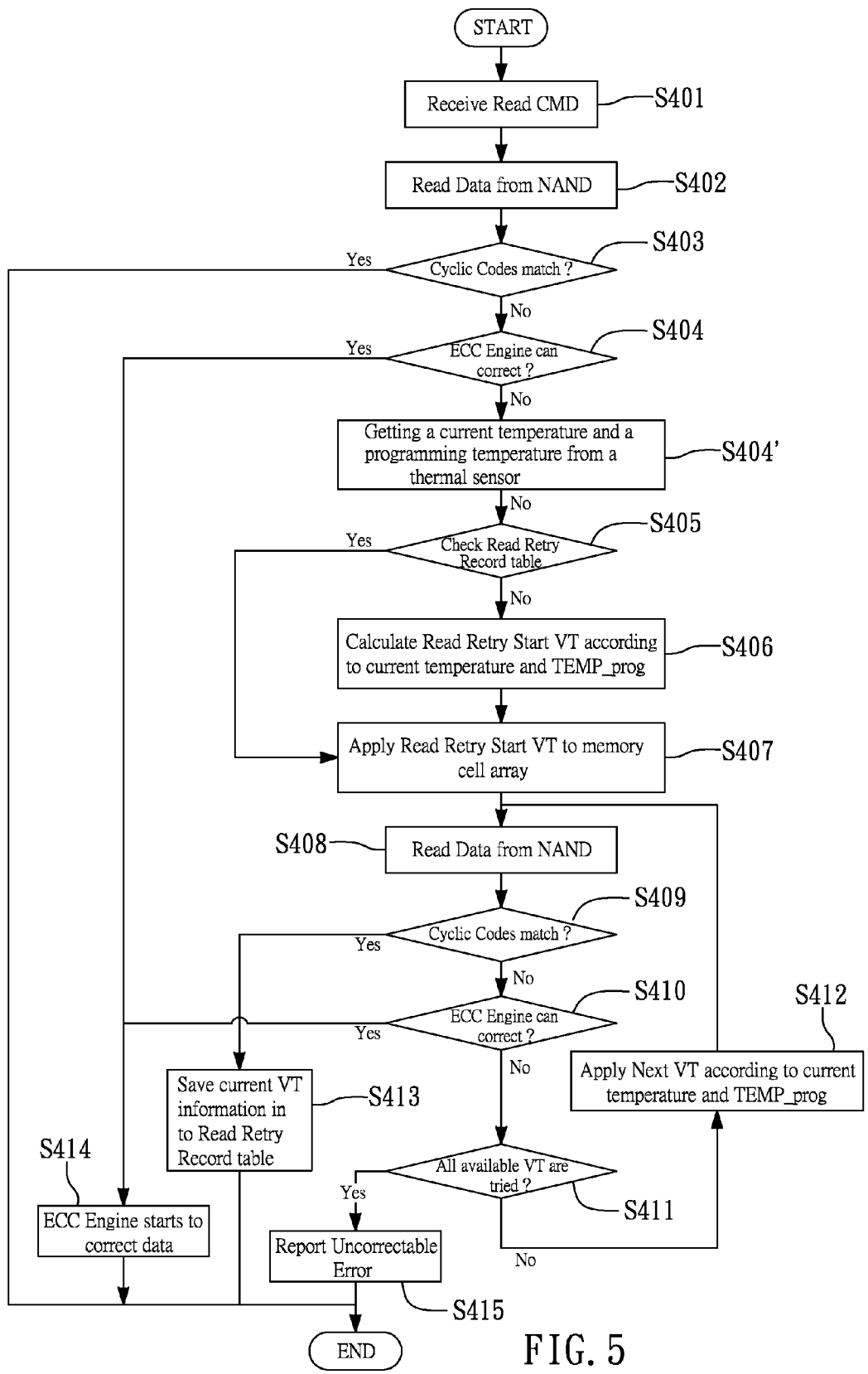
FIG. 5 is a detail flowchart showing a flash memory device handling read command according to an embodiment of present invention.

Please refer to FIG. 5, which is a detail flowchart showing a flash memory device handling read command according to an embodiment of present invention.

The detail steps for the process of a flash memory device handling write command according to an embodiment of present invention are:

step S401: received a read CMD;

step S402: read data from a NAND flash memory;

step S403: judging if the Cyclic Codes match; if yes, terminates the process; if no, runs to next step;

step S404: checking if an ECC engine can correct; if yes, the ECC engine starts to correct (step S414); if no, runs to next step;

step S404': getting a current temperature and a programming temperature (TEMP_prog) from the thermal sensor disposed inside or outside the flash memory, wherein the current temperature is detected by the thermal sensor while the flash memory is unusing or before programming, and the programming temperature is detected by the thermal sensor while the flash memory is programming;

step S405: checking a Read Retry Record table; check if a physical address has ever applied Read Retry method and has proper start test voltage record; if yes, jumps to step S407; if no, runs to next step;

step S406: calculating Read Retry start test voltage VT according to the current temperature and the programming temperature;

step S407: applying the Read Retry start test voltage VT to a memory cell array;

step S408: reading data from the NAND flash memory;

step S409: judging if the Cyclic Codes match; if yes, saves the current test voltage VT to Read Retry Record table (step S413); if no, runs to next step;

step S410: checking if the ECC engine can correct; if yes, runs to step S414; if no, runs to next step; and step S411: checking if all available test voltages VT are tried; if yes, reports an uncorrectable error (step S415); if no, applying another test voltage VT and loops to step S408 (step S412).

In the step S401, a Flash Controller receives a read CMD from a HOST. In the step S402, the Flash Controller translates logical address to physical address and reads data from the NAND flash memory. In the step S403, the Flash Controller calculates a Cyclic Code with data read from the NAND flash memory, and compares with the Cyclic Code saved in the NAND flash memory. In the step S404, the ECC Engine checks if error bit number is within maximum error bit tolerance. In the step S406, the Flash Controller checks the programming temperature of the required data, and compares with current temperature. With certain arithmetic, the Flash Controller uses a proper value for the start test voltage VT. In the step S408, the Flash Controller reads data from the NAND flash memory again. In the step S409, the Flash Controller calculates Cyclic Codes with data read from the NAND flash memory, and compares with Cyclic Code saved in the NAND flash memory. In the step S410, the ECC Engine checks if error bit number is within maximum error bit tolerance. In the step S411, number of test voltages VT may be predefined. In the step S412, apply a next test voltage VT according to the current temperature and the TEMP_prog (programming temperature). The value of the next test voltage VT may be determined by certain arithmetic with current temperature and programming temperature. In the step S414, the ECC Engine works and gets correct data. In the step S415, returns data uncorrectable information.

Temperature information is derived from a thermal sensor, and it will be recorded before write command finished. This information stands for the programming temperature of data. When this data is requested by HOST, the read flow will be as FIG. 5. If temperature of this moment is significantly different from the temperature of programming, then cell distribution would shift for a distance. We call the temperature difference, between program and read, as T-factor. With information of T-factor, compensation voltage could be applied to select start test voltage. That means some unnecessary test voltage level could be skip in prediction. If error bit number of read data with this sense voltage is over ECC engine capability, next test voltage would be applied. With aid of T-factor, we could judge the direction of next test voltage. That is, next test voltage could be either higher voltage level or lower voltage level. Once a sense voltage gets data with correctable error bit number, records this test voltage. This information will be referenced for defining start test voltage if the same page is read by HOST next time.

Figure 6:
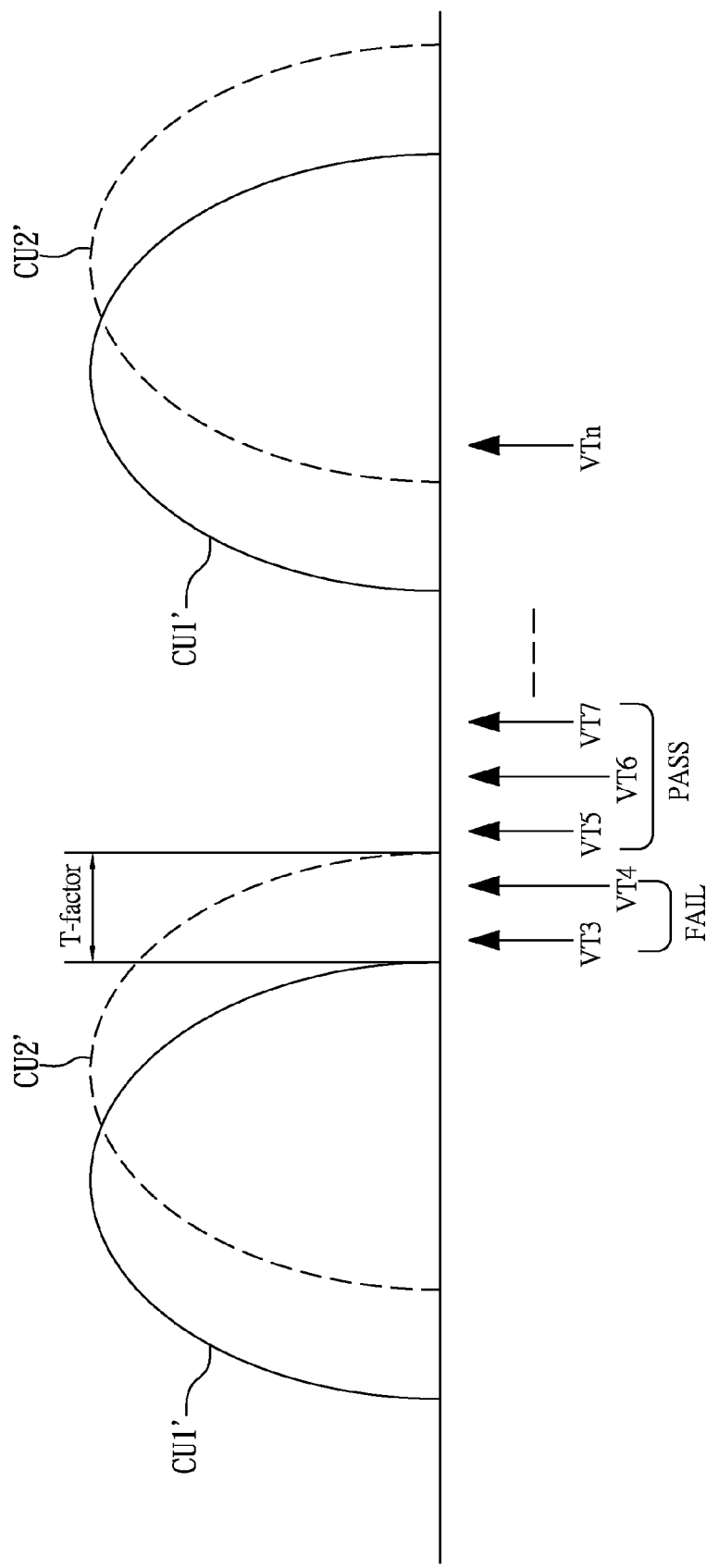
FIG. 6 is an example of Read Retry in FIG. 5.

Please refer to FIG. 6, which is an example of Read Retry in FIG. 5.

A first pulse curve CU1' under a first temperature, such as room temperature, and a second pulse curve CU2' under a second temperature, such as programming temperature higher than room temperature (same as for lower than room temperature), are different, where the horizontal axis is time and the vertical axis is the quantity of data. Under the first temperature, the process starts from test voltage VT1 to test voltage VTn, e.g. test voltage VT1 to test voltage VT7. And then, under the second temperature, the to second pulse curve CU2' is shifted a T-factor to right of the first pulse curve CU1', but the process only starts from test voltage VT3 to test voltage VTn to test, e.g. compared to the first pulse curve CU1' and FIG. 3, test voltages VT1~VT4 could be skipped, and test voltages VT5 to VT7 are passed.

Figure 3:
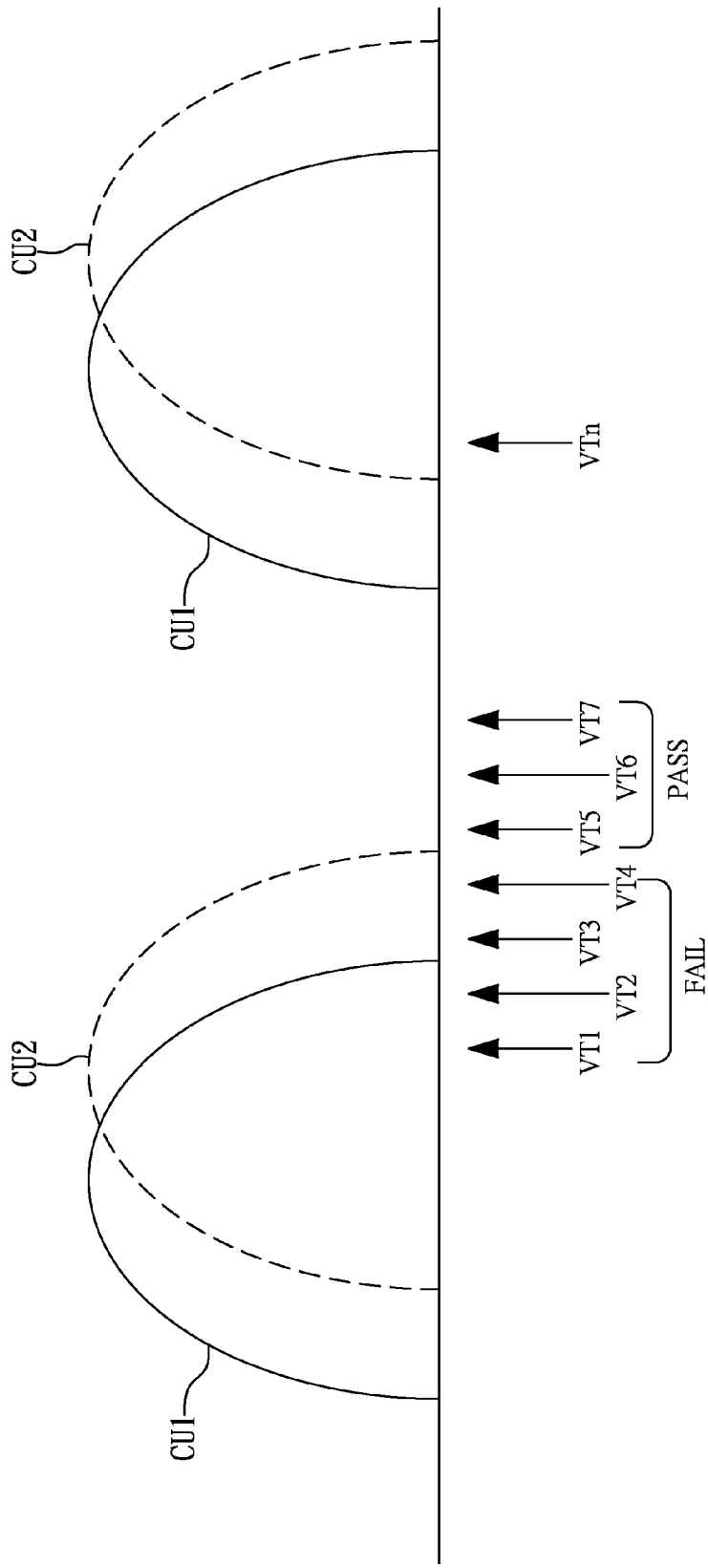
FIG. 3 is a concept of Read Retry in FIG. 2.

Give an example, a user takes photos at North Pole. It means that data is programmed into a flash memory at −20'C. After the tour, the user comes back to tropic zone and shows the photo to friends, that is, data is read from the flash memory at 40° C. Temperature difference over 60 degrees may result in voltage shift as shown in FIG. 3. For legacy Read Retry methods, it needs to try from test voltage VT1 to test voltage VT5 for each loop to get correct data. But for the method according to this invention, it can be only started from test voltage VT5 directly without extra tests. The efficiency is improved almost 30%.

Therefore, the method according to this invention is capable of shortening the test time according to the current temperature sensed by a thermal sensor and improving the efficiency.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for improving performance when a flash memory storage device works in a wide temperature range, the steps comprising:
    step SA01: received a read CMD;
    step SA02: read data from a NAND flash memory;
    step SA03: judging if the cyclic Codes match; if yes, terminates the process; if no, runs to next step;
    step SA04: checking if an ECC engine can correct; if yes, the ECC engine starts to correct; if no, runs to next step;
    step SA04': getting a current temperature and a programming temperature from a thermal sensor;
    step SA05: checking a Read Retry Record table; check if a physical address has ever applied a Read Retry method and has proper start test voltage record; if yes, jumps to next two step; if no, runs to next step;
    step SA06: calculating a Read Retry start test voltage according to the current temperature and the programming temperature;
    step SA07: applying the Read Retry start test voltage to a memory cell array;
    step SA08: reading data from the NAND flash memory;
    step SA09: judging if the Cyclic Codes match; if yes, saves the current test voltage to the Read Retry Record table; if no, runs to next step;
    step SA10: checking if the ECC engine can correct; if yes, runs to step SA04; if no, runs to next step; and
    step SA11: checking if all available test voltages are tried; if yes, reports an uncorrectable error; if no, applying another test voltage and loops to step SA08.

2. The method as claimed in claim 1, wherein the thermal sensor is disposed inside or outside the NAND flash memory.

* * * * *